(12) United States Patent
Elkins et al.

(10) Patent No.: US 8,161,249 B1
(45) Date of Patent: *Apr. 17, 2012

(54) METHOD AND APPARATUS FOR MULTI-PORT ARBITRATION USING MULTIPLE TIME SLOTS

(75) Inventors: Adam Elkins, Rio Rancho, NM (US); Thomas H. Strader, San Jose, CA (US); Wayne E. Wennekamp, Rio Rancho, NM (US); Schuyler E. Shimanek, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 12/694,656

(22) Filed: Jan. 27, 2010

Related U.S. Application Data

(60) Provisional application No. 61/148,926, filed on Jan. 31, 2009, provisional application No. 61/148,927, filed on Jan. 31, 2009.

(51) Int. Cl.
*G06F 12/00* (2006.01)
*H03K 19/177* (2006.01)

(52) U.S. Cl. ........ 711/149; 711/150; 711/151; 711/167; 365/220; 365/221; 365/222; 326/39; 326/38

(58) Field of Classification Search .......... 711/149–151, 711/105, 167; 716/16, 18; 326/38–41
See application file for complete search history.

(56) References Cited

U.S. PATENT DOCUMENTS

| | | | | |
|---|---|---|---|---|
| 6,317,804 | B1 * | 11/2001 | Levy et al. ............ | 710/305 |
| 7,120,761 | B2 * | 10/2006 | Matsuzaki et al. ...... | 711/149 |
| 7,587,697 | B1 * | 9/2009 | Schmit et al. .......... | 716/16 |

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.
U.S. Appl. No. 12/692,771, filed Jan. 25, 2010, Flateau, Jr.,et al., Xilinx, Inc., 2100 Logic Drive, San Jose, CA.

(Continued)

*Primary Examiner* — Vibol Tan
(74) *Attorney, Agent, or Firm* — T. Murray Smith; Kevin T. Cuenot; Thomas George

(57) ABSTRACT

An apparatus includes a programmable device that has an interface and command ports that can each receive commands, each command requesting an information transfer through the interface. A technique relating to the device involves: selecting during field programming a number of priority definitions; configuring each of the priority definitions during field programming to specify an order of priority for a group of the command ports; and using the priority definitions in succession and, for each of the priority definitions, causing a command to be accepted from the command port of highest priority that contains a command.

20 Claims, 13 Drawing Sheets

OTHER PUBLICATIONS

U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.

* cited by examiner

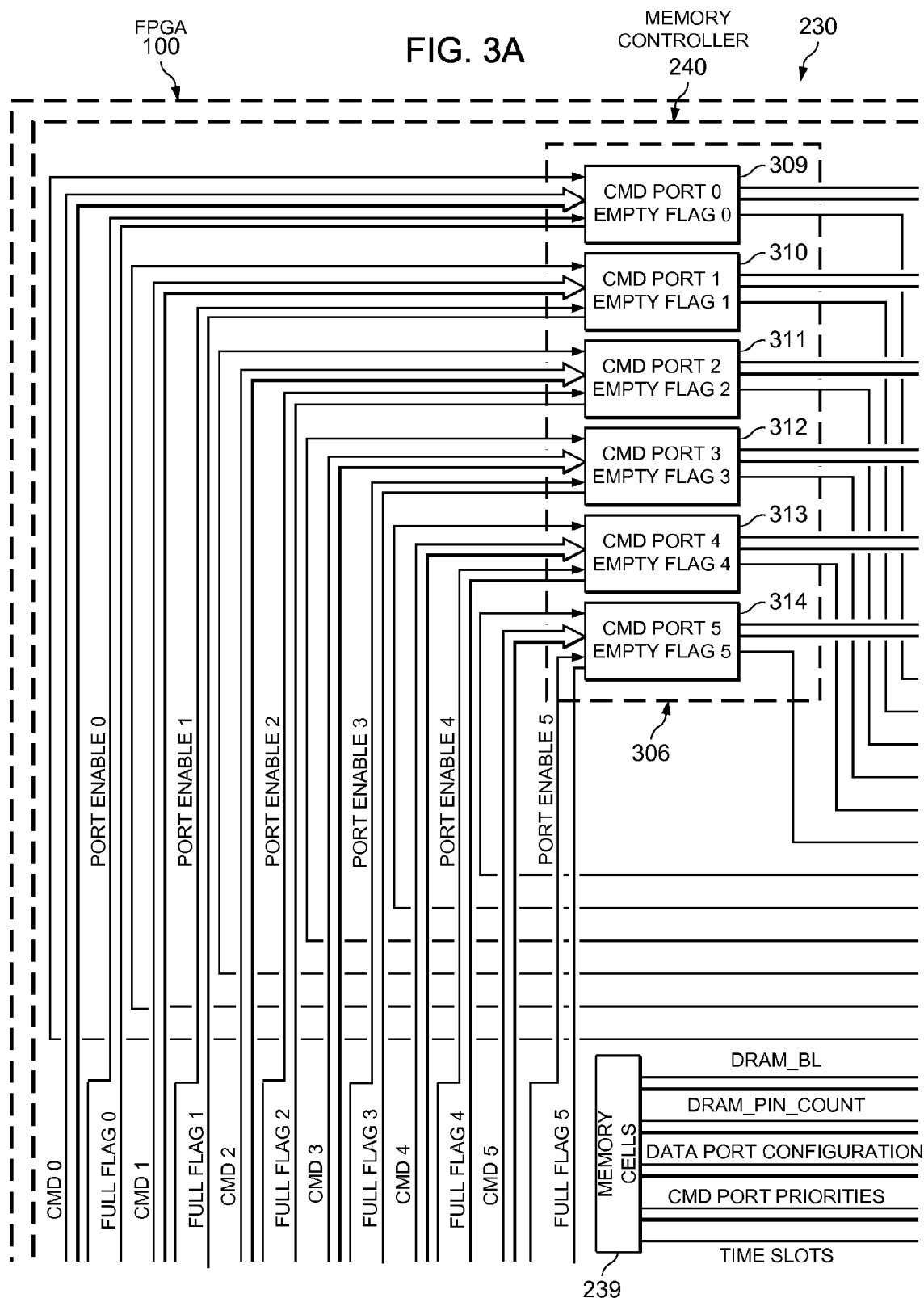

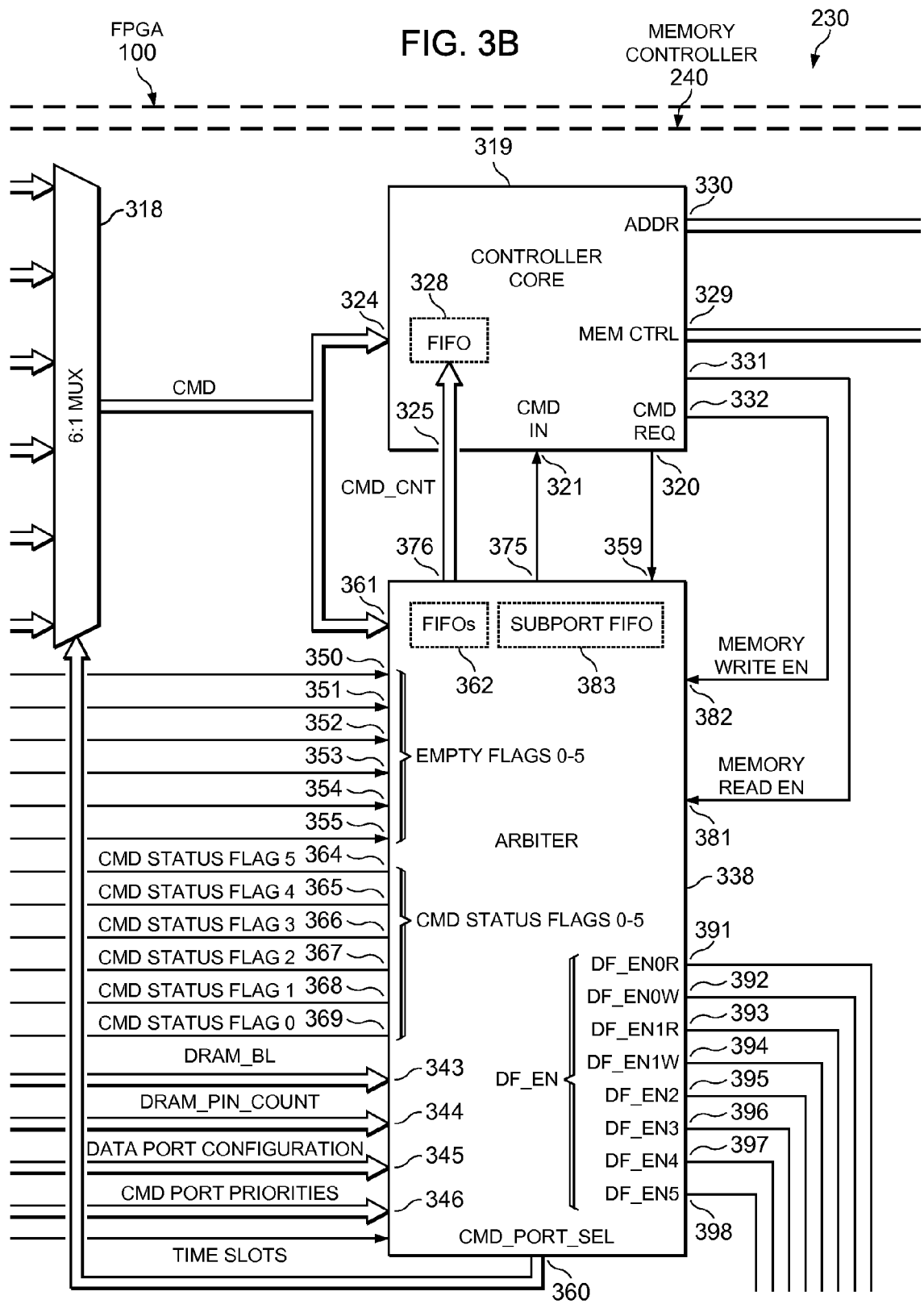

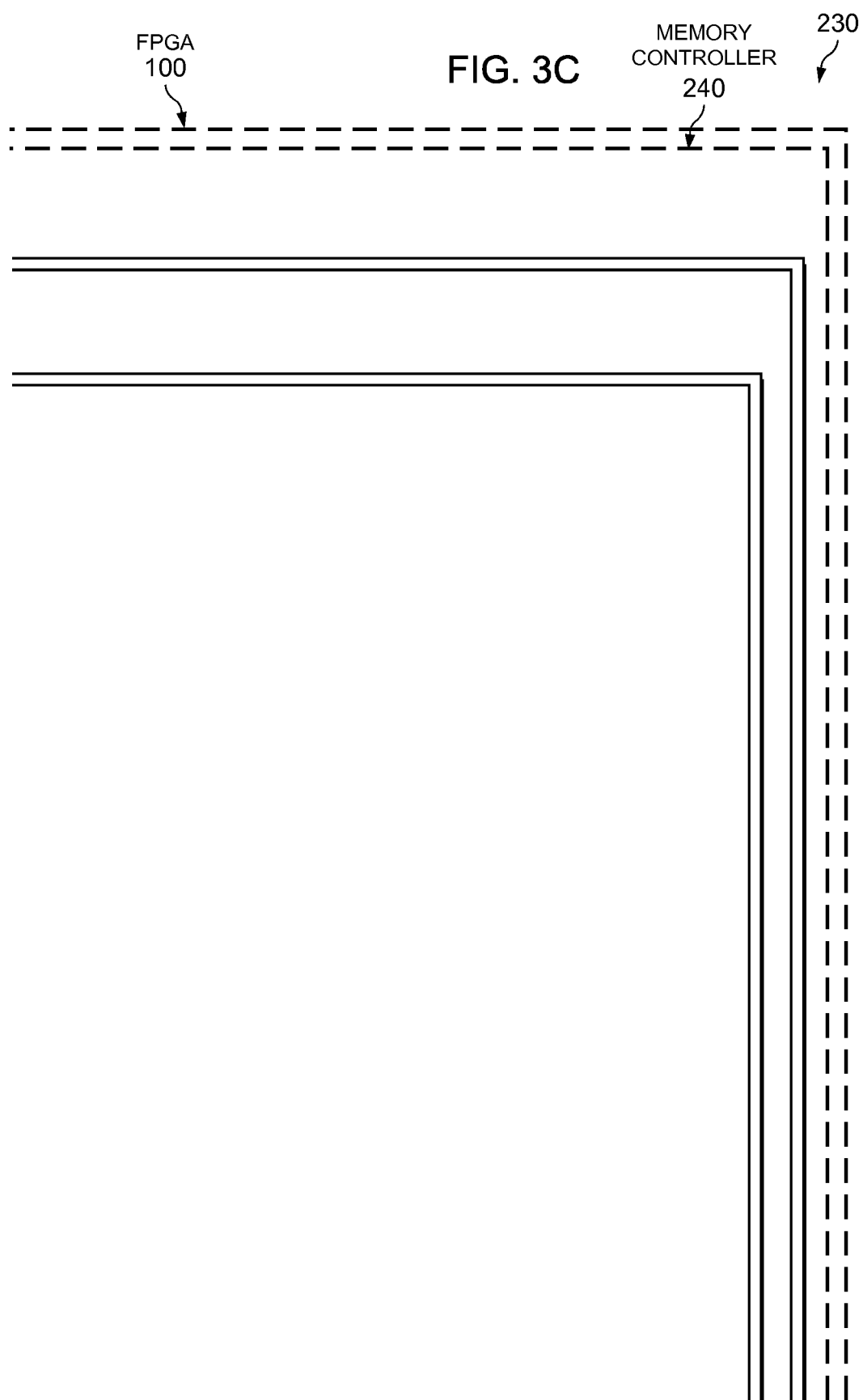

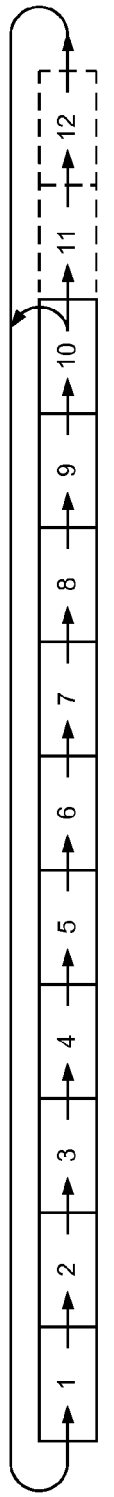

METHOD AND APPARATUS FOR MULTI-PORT ARBITRATION USING MULTIPLE TIME SLOTS

CROSS-REFERENCE TO RELATED APPLICATIONS

This application claims the priority under 35 U.S.C. §119 of U.S. Provisional Patent Application No. 61/148,926 filed on Jan. 31, 2009 and entitled "Apparatus and Method for a Memory Controller", and also U.S. Provisional Patent Application No. 61/148,927 filed on Jan. 31, 2009 and entitled "Architecture for Advanced Integrated Circuit Providing Good Performance and Low Cost". The disclosures of both of these provisional patent applications are hereby incorporated herein by reference in their entirety.

FIELD OF THE INVENTION

An embodiment of the invention relates to techniques for transferring data to and from a memory. More particularly, an embodiment of the invention relates to techniques for performing arbitration among multiple ports in a memory controller.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs are sometimes field programmed to define a memory controller that interfaces the PLD to an external memory device. Such a memory controller may include multiple ports through which the memory controller may receive memory access requests. When two or more of these ports want to simultaneously transfer data to or from the memory, the memory controller must determine an order of priority in which the ports will be given memory access. Although existing techniques for determining an order of priority have been generally adequate for their intended purposes, they have not been entirely satisfactory in all respects.

SUMMARY OF THE INVENTION

One embodiment of the invention involves an apparatus that includes a programmable device. The programmable device includes an interface, and a plurality of command ports that can each receive commands, each command requesting an information transfer through the interface. The programmable device also includes arbitration circuitry configurable during field programming to include a selected number of priority definitions, the selected number being determined during field programming, and each priority definition being configurable during field programming to specify an order of priority for a group of the command ports. In operation, the arbitration circuitry uses the priority definitions in succession and, for each of the priority definitions, causes a command to be accepted from the command port of highest priority that contains a command.

Another embodiment of the invention involves a method relating to an apparatus having a programmable device that includes an interface and a plurality of command ports that can each receive commands, each command requesting an information transfer through the interface. The method includes: selecting during field programming a number of priority definitions; configuring each of the priority definitions during field programming to specify an order of priority for a group of the command ports; and using the priority definitions in succession and, for each of the priority definitions, causing a command to be accepted from the command port of highest priority that contains a command.

BRIEF DESCRIPTION OF THE DRAWINGS

FIG. 4 is a diagram showing twelve time slots that are used by the arbiter of FIG. 3 as it selects one of the command ports from which it will read a command.

FIG. 5 is a diagram showing the twelve time slots of FIG. 4, and also showing an example of a priority definition for each of the time slots.

DETAILED DESCRIPTION

Figure 1:
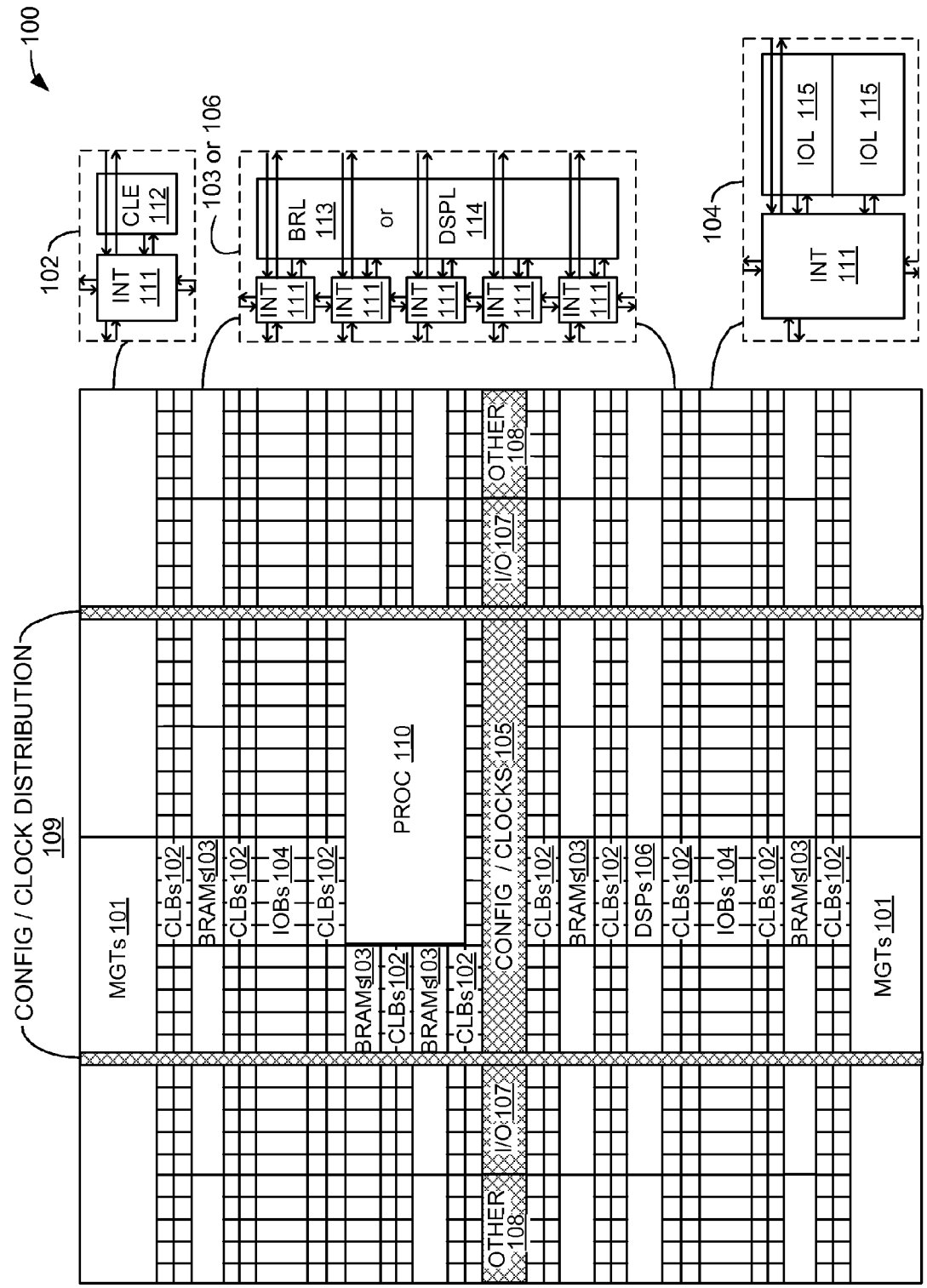
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
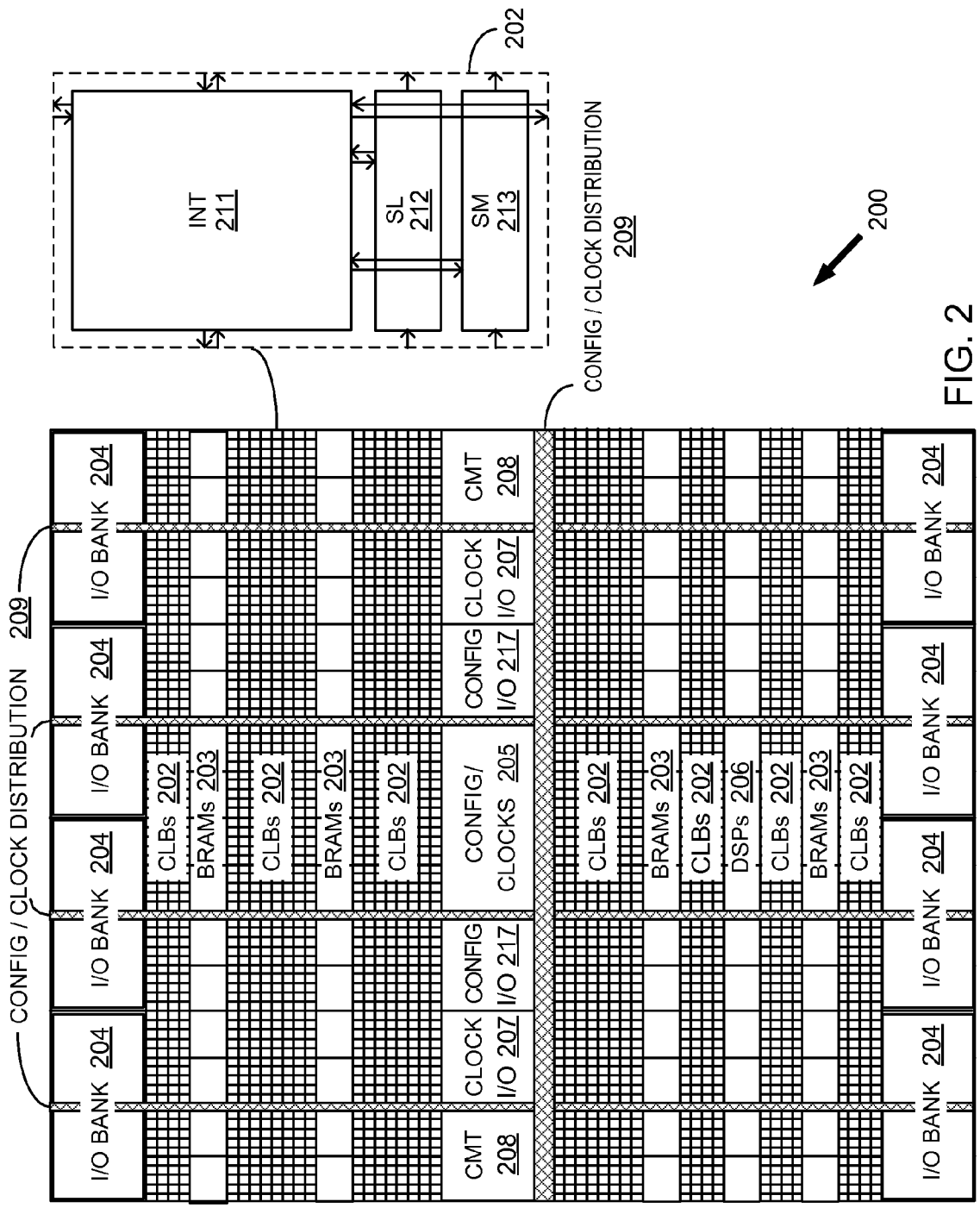
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
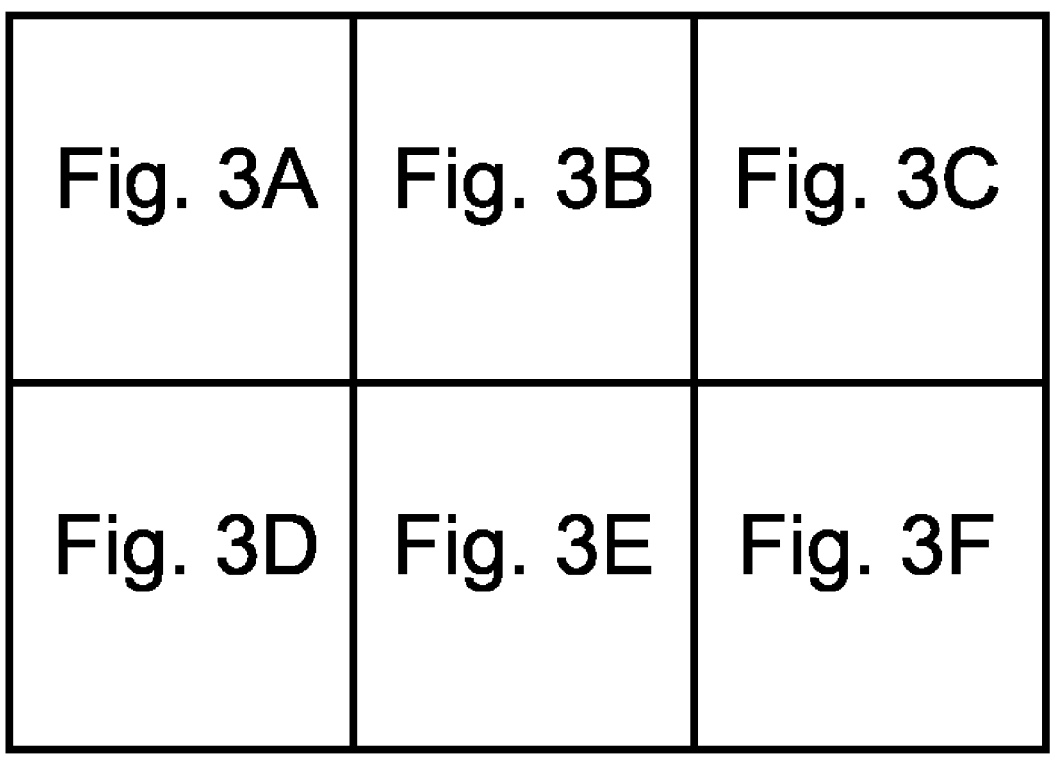
FIG. 3 (which includes FIGS. 3A-3F) is a block diagram showing an apparatus in the form of a circuit that includes the FPGA of FIG. 1 and a dynamic random access memory (DRAM), where the FPGA includes a memory controller circuit that in turn has a plurality of command ports and an arbiter.
Figure 3D:
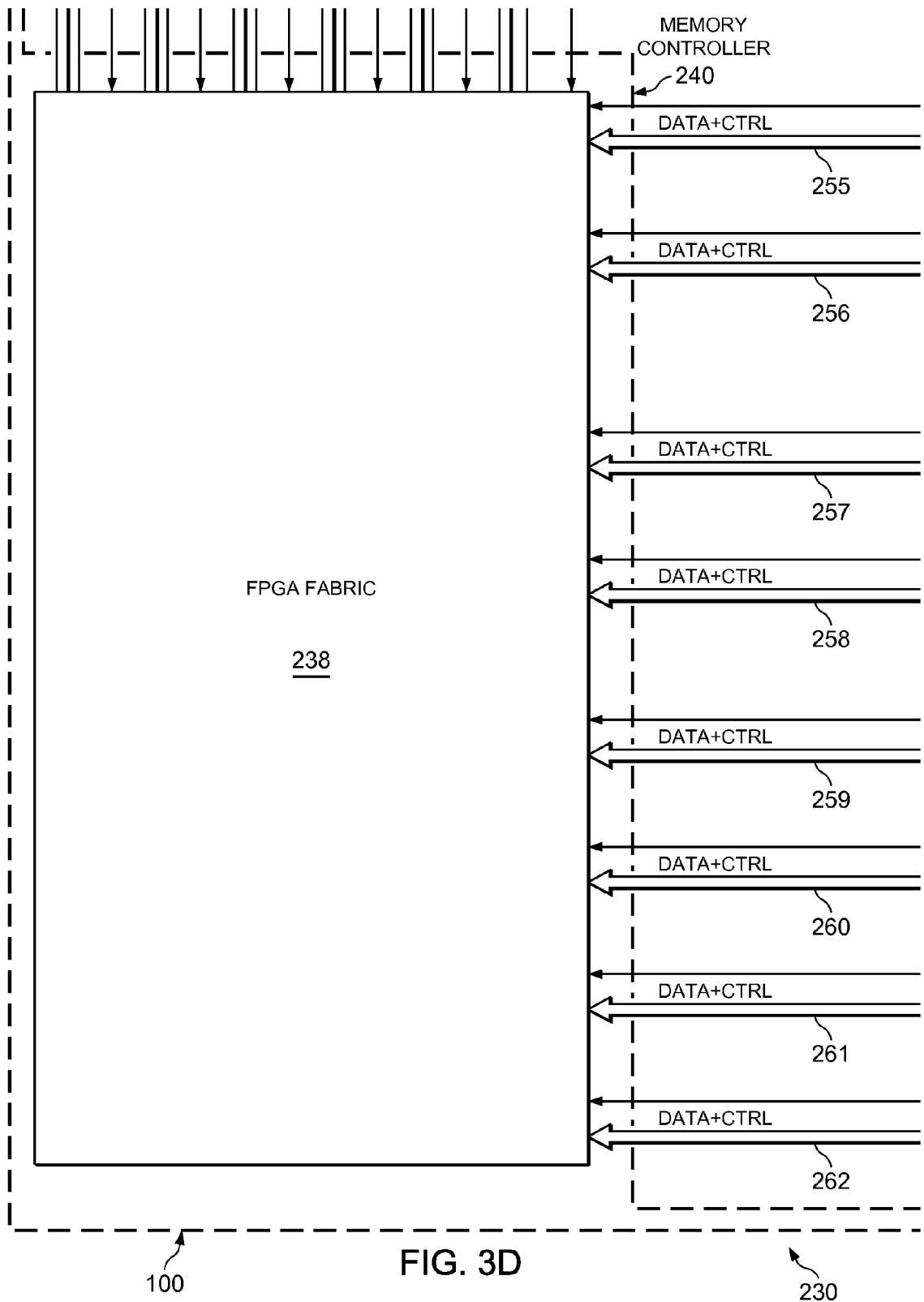
Figure 3E:
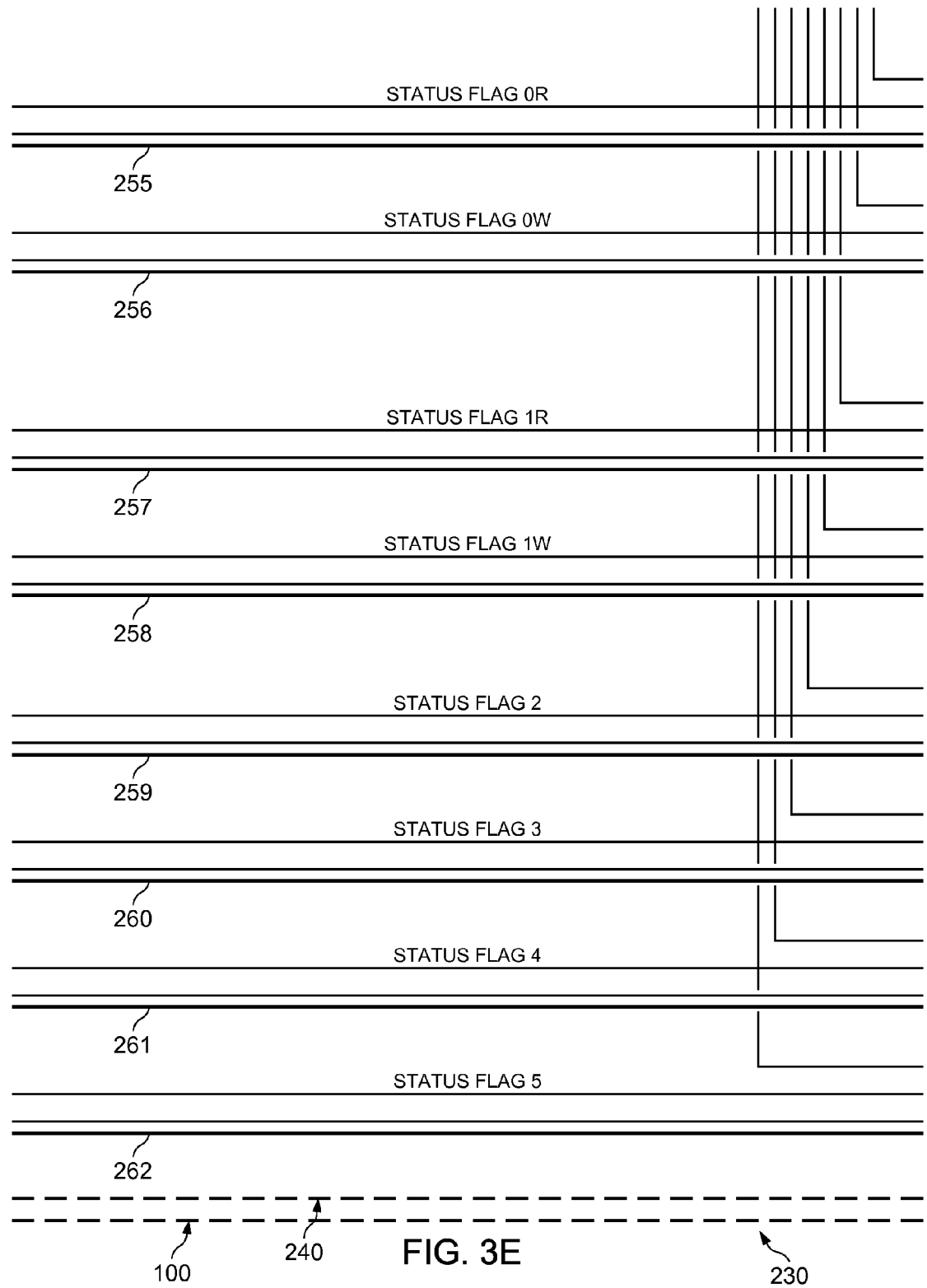
Figure 3F:
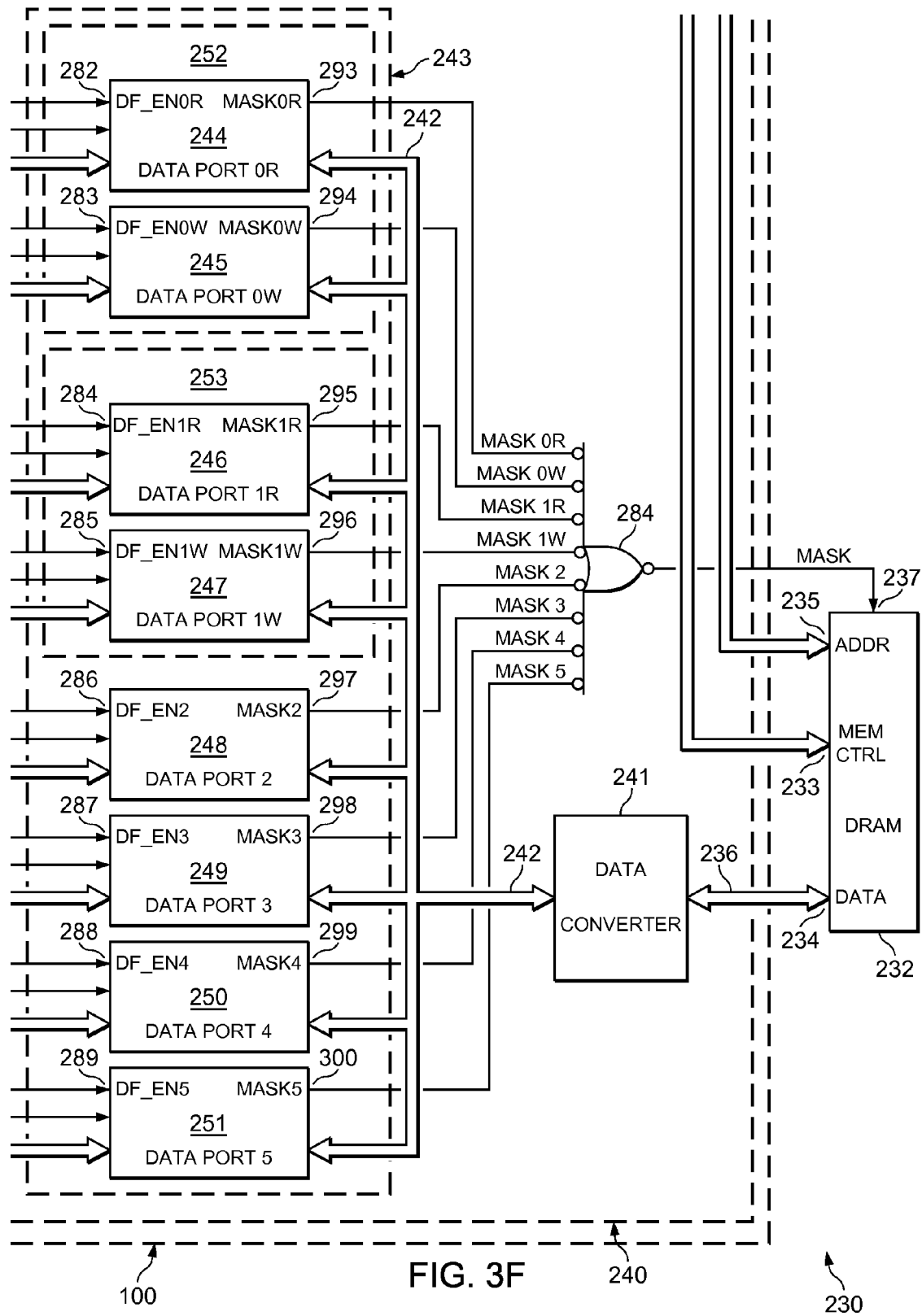

FIG. 3 (which includes FIGS. 3A-3F) is a block diagram showing an apparatus 230 in the form of a circuit that includes the FPGA 100 of FIG. 1, and a dynamic random access memory (DRAM) 232. The FPGA 100 in FIG. 3 could alternatively be the FPGA 200 of FIG. 2. FIG. 3 does not show everything in the FPGA 100. FIG. 3 shows only portions of the FPGA that facilitate an understanding of the disclosed embodiment of the invention.

In the embodiment shown in FIG. 3, the DRAM 232 is a standard double data rate (DDR) device having a standard memory interface. Alternatively, however, the DRAM 232 could be a memory of a different double data rate type, for example DDR2, DDR3, LPDDR, or mobile DDR. As another alternative, the DRAM 232 could be any of a variety of other memory devices. For example, the DRAM 232 could be a memory of the type known as a single data rate (SDR) device. The memory interface of the DRAM 232 includes a memory control input 233 for receiving MEM CTRL signals, a data interface 234 for receiving and outputting data, and an address input ADDR 235 that receives a memory address. The data interface 234 is coupled to a data bus 236. The DRAM 232 also includes an input 237 for receiving a signal MASK. As discussed in more detail later, the signal MASK is used during memory writes to advise the DRAM 232 to ignore portions of a memory access that are not to be written.

The DRAM 232 has a DRAM PIN_COUNT that is the width of each memory location in the DRAM, and that is also the width of the data interface 234 of the DRAM 232. For purposes of the following discussion it is assumed that, in the disclosed embodiment, the DRAM PIN_COUNT is 8 bits. In alternative embodiments, however, the DRAM PIN_COUNT could be 4 bits or 16 bits, or any other suitable number of bits. In addition, the DRAM 232 has a memory burst length DRAM_BL. The DRAM_BL is the number of memory words accessed during each memory access carried out by the DRAM 232. For purposes of the following discussion it is assumed that, in the disclosed embodiment, the DRAM_BL is 8 words. In alternative embodiments, however, the DRAM_BL could be 4 words, or any other suitable number of words. In the disclosed embodiment, during each memory access, the DRAM 232 has 8 time slots during which it can read eight 8-bit words for a READ command, or write eight 8-bit words for a WRITE command. As a practical matter, during a WRITE command, less than 8 words may actually be written into the memory (as discussed in more detail later), but all 8 time slots still occur. For each memory access, the DRAM 232 accesses eight 8-bit words, or 64 bits in total. Accordingly, a data transfer sequence involving an integer multiple of memory access cycles is needed for data transfers greater than 64 bits.

The DRAM 232 is conceptually divided into a series of contiguous blocks each equal in size to the DRAM_BL and thus having 64 bits, and each having respective start and end memory address boundaries. READ and WRITE accesses each need to start and end on a boundary. In instances where either the start or end memory address of a READ or WRITE command does not coincide with a boundary, then during a READ the system ignores certain portions of memory blocks that are accessed. During a WRITE, the signal MASK is used to tell the DRAM 232 not to write data into certain locations.

In more detail, there are four different data transfer scenarios with regard to memory address boundaries. For example, a data transfer may have start and end memory addresses that each coincide with a respective memory address boundary. In this case, no masking is needed. In another scenario, a data transfer may have a start memory address that is aligned with a memory boundary and an end memory address that falls between memory boundaries. In this case, post-masking is carried out to ignore memory locations between the end memory address and the closest subsequent memory address boundary. In yet another scenario, a data transfer may have a start memory address that falls between memory boundaries and an end memory address that is aligned with a memory address boundary. In this case, pre-masking is carried out to ignore memory locations between the closest previous memory address boundary and the start memory address. In a further scenario, a data transfer may have start and end memory addresses that each fall between memory boundaries. In this case, both pre-masking and post-masking are needed.

The FPGA 100 includes an FPGA fabric 238, and a memory controller 240 that serves as a data transfer portion. In regard to data to be written into or read from the DRAM 232, the FPGA fabric 238 is configurable for transfers of data having one or more predetermined word widths. For example, the FPGA fabric 238 can be configured to receive and transmit data having a word width of 32 bits, 64 bits, or 128 bits. Alternatively, the FPGA fabric 238 could be configured to receive or transmit words having a width that is any other number of bits. In addition, in some instances the FPGA fabric 238 can be configured to receive and transmit data having a first word width that is one of 32, 64 and 128 bits, and to receive and transmit data having a second word width that is a different one of 32, 64 and 128 bits.

The memory controller 240 facilitates transfer of data between the FPGA fabric 238 and the DRAM 232. The memory controller 240 includes memory cells 239 that are configurable structure. The memory cells 239 store information about the DRAM 232 and the memory controller 240. In particular, the memory cells 239 store the memory burst length DRAM_BL and the pin count DRAM PIN_COUNT of the DRAM 232. Also, the memory cells 239 include data port configuration information for some data ports that are in the memory controller 240, as well as priority information relating to command ports (command port priorities), as described in further detail later. The memory cells 239 also store a TIME SLOTS bit that indicates whether the memory controller 240 should operate with 10 time slots or 12 time slots (which are described in detail later). The information stored in the memory cells 239 is specified by a user during field programming of the FPGA.

The memory controller 240 includes a portion that is a data converter 241. The data converter 241 has an interface that is coupled to the data bus 236. Also, the data converter 241 has another interface that is coupled to a data bus 242 that is 32 bits wide. In general, when the DRAM 232 is a DDR device, the data converter 241 converts data to and from DDR format data for WRITE and READ data transfers between the memory controller 240 and the DRAM 232. For a WRITE data transfer, the data converter 241 takes each word received from other circuitry within the memory controller, configures it as DDR data by splitting it into two halves, and then successively passes the two halves on to the DRAM 232. For a READ data transfer, the data converter captures each data word output by the DRAM 232, and synchronizes it to an internal clock signal of the memory controller 240. The data converter 241 takes two successive data words from the DRAM 232 (DDR data), and combines them into a single larger data word that the data converter then passes on to other circuitry within the memory controller.

In further detail, and as discussed above, the DRAM 232 in the disclosed embodiment has a pin count of 8 bits. With respect to data transfers between the DRAM 232 and the data converter 241, 8 bits of data are transferred on each edge of each pulse of a not-illustrated DQS signal. Accordingly, a total of 16 bits of data is transferred between the data converter 241 and the DRAM 232 on each pulse of the DQS signal. Therefore, for a READ data transfer, the data converter 241 combines two 8-bit data words from the DRAM into a single 16-bit data word that is then passed on to other circuitry within the memory controller 240 over the data bus 242. For a WRITE data transfer, the data converter 241 takes each 16-bit data word arriving over the data bus 242, and divides it into two 8-bit data words (DDR data) that are successively sent to the DRAM 232 over the data bus 236.

In an alternative embodiment, the DRAM 232 could be replaced with a memory of the type known as a single data rate (SDR) device. In that case, for both READ and WRITE data transfers, the data converter 241 does not alter data that passes through it.

The memory controller 240 includes a data storage portion 243 that is coupled between the FPGA fabric 238 and the data converter 241, and that is configurable by a user during field programming of the FPGA. The data storage portion 243 temporarily stores data that is being transferred between the FPGA fabric 238 and the DRAM 232. The data storage portion 243 includes eight independently controlled data ports 244-251 which are each a first-in-first-out (FIFO) storage device that serves as a storage element. Each of the data ports 244-251 can store up to 64 words that are each 32 bits wide. In addition, the data ports 244-251 can be configured for concatenation. For example, two of the 32-bit data ports 244-251 can be concatenated to store 64-bit words, or four of the 32-bit data ports 244-251 can be concatenated to store 128-bit words. So in general, the data storage portion 243 can be configured to have (1) only 32-bit data ports, (2) a combination of 32-bit and 64-bit data ports, (3) only 64-bit data ports, or (4) only 128-bit data ports. In this manner, the memory controller 240 is configurable to transfer FPGA data words having 32, 64, and/or 128 bits.

The data ports 244 and 246 provide storage for unidirectional data transfers from the DRAM 232 to the FPGA fabric 238 (READ). The data ports 245 and 247 provide storage for unidirectional data transfers from the FPGA fabric 238 to the DRAM 232 (WRITE). The pair of data ports 244 and 245 and the pair of data ports 246 and 247 form respective bidirectional dual data ports 252 and 253. The data ports 248-251 also provide storage for unidirectional transfers, and are independently configurable to temporarily store data for either READ data transfers or WRITE data transfers. The ports 248-251 must each be designated as either a read port or a write port during field configuration, and that designation does not thereafter change. Accordingly, there are a variety of possible configurations of the data storage portion 243.

In more detail, in one configuration the data storage portion 243 is configured to have only 32-bit data storage elements. In this scenario, the data ports 244 and 246 each provide storage for unidirectional READ data transfers and the data ports 245 and 247 each provide storage for unidirectional WRITE data transfers. Moreover, the other four data ports 248-251 are independently configured so that each provides storage for either unidirectional READ data transfers or unidirectional WRITE data transfers. Thus, the four data ports 248-251 can be configured as (1) four data ports that each provide storage for unidirectional READ data transfers, (2) one data port that provides storage for unidirectional READ data transfers and three data ports that provide storage for unidirectional WRITE data transfers, (3) two data ports that provide storage for unidirectional READ data transfers and two data ports that provide storage for unidirectional WRITE data transfers, (4) three data ports that provide storage for unidirectional READ data transfers and one data port that provides storage for unidirectional WRITE data transfers, or (5) four data ports that each provide storage for unidirectional WRITE data transfers.

In another scenario, the data storage portion 243 is configured to have 64-bit data storage elements. For example, the two 32-bit data ports 244 and 246 can be concatenated and the two 32-bit data ports 245 and 247 can be concatenated, in order to form two 64-bit data storage elements that respectively provide for 64-bit READ and WRITE data transfers. When the data ports 244-247 are concatenated to form 64-bit storage elements, the data ports 248-251 can each be configured to be a 32-bit data port, or alternatively the data ports 248-251 can be configured to define two 64-bit storage elements. For example, the two 32-bit data ports 248 and 250 can be concatenated to form a 64-bit data storage element that provides for 64-bit READ data transfers, and the two 32-bit data ports 249 and 251 can be concatenated to form a 64-bit data storage element that provides for 64-bit WRITE data transfers. If the data ports 248-251 are concatenated to define two 64-bit storage elements, the data ports 244-247 can be configured as either four 32-bit storage elements or as two 64-bit storage elements.

In yet another scenario, the data storage portion 243 is configured to have only 128-bit storage elements. In this scenario, the four 32-bit data ports 244, 246, 248, and 250 are concatenated, and the four 32-bit data ports 245, 247, 249, and 251 are concatenated, in order to form two 128-bit data storage elements that respectively provide temporary storage for 128-bit READ and WRITE data transfers.

As one example of a specific configuration that will facilitate the discussion that follows, assume that in FIG. 3 the data storage portion 243 is configured to provide for a combination of 32-bit and 64-bit data storage elements. In particular, assume that the data ports 244 and 246 are concatenated and that the data ports 245 and 247 are concatenated to form two 64-bit storage elements that respectively provide temporary storage for READ and WRITE data transfers. In addition, assume that the data ports 248 and 250 are each configured to provide temporary 32-bit storage for READ data transfers, while the data ports 249 and 251 are each configured to provide temporary 32-bit storage for WRITE data transfers.

Each of the data ports 244-251 produces a status flag signal STATUS FLAG that is supplied to the FPGA fabric 238. In particular, status flag signals STATUS FLAG 0R, STATUS FLAG 0W, STATUS FLAG 1R, STATUS FLAG 1W, STATUS FLAG 2, STATUS FLAG 3, STATUS FLAG 4, and STATUS FLAG 5 are respectively produced by the data ports 244-251. When actuated, each STATUS FLAG signal indicates that the associated data port is empty if that data port is configured for READs, or indicates that the associated data port is full if it is configured for WRITEs. If two or four data ports are concatenated, then only one STATUS FLAG signal corresponding to the last of those concatenated data ports is actually used.

For example, in the hypothetical configuration that is being assumed here for FIG. 3, the signal STATUS FLAG 1R for data port 246 is used to indicate when concatenated data ports 244 and 246 are empty, while STATUS FLAG 0R for data port 244 is ignored. Similarly, the signal STATUS FLAG 1W for data port 247 is used to indicate when concatenated data ports 245 and 247 are full, while STATUS FLAG 0W for data port 245 is ignored. Each of the STATUS FLAGs from the data ports 248 and 250 indicates when that data port is empty. Also, each of the STATUS FLAGs from the data ports 249 and 251 indicates when that data port is full.

Each of the data ports 244-251 is coupled to a respective one of eight bidirectional buses 255-262 that each carry control signals and 32 bits of data between that data port and the FPGA fabric 238. Each of the buses 255-262 and the associated STATUS FLAG signal serve as an interface between the fabric 238 and a respective one of the data ports 244-251. Each of the data ports 244-251 is also coupled to the common data bus 242 that is 32 bits wide. The data ports 244-251 have respective enable inputs 282-289 for receiving respective active-high enable signals DF_EN 0R, DF_EN 0W, DF_EN 1R, DF_EN 1W, DF_EN 2, DF_EN 3, DF_EN4, and DF_EN 5. Each of these enable signals independently enables a respective data port 244-251 to receive or output data.

Each of the data ports 244-251 has a respective one of eight mask outputs 293-300, at which it can produce a respective one of eight active-high signals MASK 0R, MASK 0W, MASK 1R, MASK 1W, MASK 2, MASK 3, MASK 4, and MASK 5. These signals depend on the respective enable signals. For example, consider data port 244. If the enable signal DF_EN 0R that is received at the enable input 282 is asserted, the mask signal MASK 0R at the mask output 293 is set to a logic low. Conversely, if the enable signal DF_EN 0R that is received at the enable input 282 is deasserted, the mask signal MASK 0R at the mask output 293 is set to a logic high. The memory controller 240 also includes an 8-input NOR gate 284 having 8 inverting inputs that are respectively coupled to the 8 mask outputs 293-300 of the data ports 244-251. The NOR gate 284 outputs a signal MASK that is supplied to the mask input 237 of the DRAM 232.

An explanation is now provided of the operation of the data storage portion 243 for a memory WRITE operation involving the transfer of a 64-bit data word from the FPGA fabric 238 to the DRAM 232. As discussed above, it is being assumed for the sake of this discussion that, during field programming, the data ports 245 and 247 were concatenated to form a 64-bit storage element. Also assume that the 64-bits of data are to be supplied through the 64-bit data storage element defined by the concatenated data ports 245 and 247. The FPGA fabric 238 first checks the signal STATUS FLAG1W from data port 247 in order to determine whether data ports 245 and 247 are currently full. If they are, then the fabric 238 waits. Otherwise, the fabric 238 can put data in the concatenated data ports 245 and 247. More specifically, the FPGA fabric 238 transfers half of the 64 bits in parallel across the data bus 255 and into the data port 245, while simultaneously transferring the other half of the 64 bits in parallel across the data bus 256 and into the data port 247. Later, the data ports 245 and 247 are sequentially enabled so that the 32 bits of data stored in each of these data ports are successively transferred across the data bus 242 and into the data converter 241 in successive groups of 16 bits. As previously discussed, the data converter 241 splits each 16-bit word into two 8-bit words that are then transferred successively across the data bus 236 and into the DRAM 232.

In greater detail, first the enable signal DF_EN 0W is asserted to enable the data port 245 so that the 32 bits in that data port are transferred in two successive groups of sixteen bits to the data converter 241. The data converter 241 divides each 16-bit data word received from the data port 245 into two 8-bit data words that conform with the DDR standard, and then successively transfers these two 8-bit data words over the data bus 236 to the DRAM 232. The data port 245 is enabled until all 32 bits have been transferred. Then, the enable signal DF_EN 0W is deasserted to disable the data port 245, and the enable signal DF_EN 1W is asserted to enable the data port 247, so that the 32 bits in that data port are transferred in two successive groups of sixteen bits over the data bus 242 and into the data converter 241. The data converter 241 divides each group of 16-bit data words received from the data port 247 into two 8-bit data words that conform with the DDR standard, and then transfers these two 8-bit data words over the data bus 236 to the DRAM 232. The data port 247 is enabled until all 32 bits have been transferred. This is one example of how data is transferred from the FPGA fabric 238 to the DRAM 232.

An explanation is now provided of the operation of the data storage portion 243 for a READ operation involving a data transfer of 64 bits of data from the DRAM 232 to the FPGA fabric 238. As discussed above, it is being assumed for the sake of this discussion that data ports 244 and 246 are concatenated to form a 64-bit storage element. Also assume that the FPGA fabric 238 decides the 64-bit data storage element defined by the concatenated data ports 244 and 246 is to be used for the transfer. The DRAM 232 supplies the 64 bits of data to the data converter 241 as four successive pairs of 8-bit words. Then, as previously explained, the data converter 241 combines each pair of incoming 8-bit words into a 16-bit word, and supplies the four 16-bit words in succession over the data bus 242 to the data ports 244 and 246. The enable signals DF_EN 0R and DF_EN 1R are sequentially asserted so that the data ports 244 and 246 are sequentially enabled to accept and store the data. In particular, first the enable signal DF_EN 0R is asserted so that the data port 244 is enabled and accepts data from the bus 242 in the form of two successive 16-bit words until the 32-bit width of the data port 244 is filled. When the width of the data port 244 is full, the enable signal DF_EN 0R is deasserted so that the data port 244 is disabled. Then the enable signal DF_EN 1R is asserted so that the data port 246 is enabled and can receive the next 32 bits of data over the data bus 242 from the DRAM 232 as two successive 16-bit words.

Thus, during the data transfer, two successive pairs of 8-bit memory words from the DRAM 232 are received by the data converter 241, which combines the words of each pair to form two successive 16-bit words that are placed in the data port 244, and two more successive pairs of 8-bit memory words from the DRAM 232 are each combined by the data converter 241 to form two successive 16-bit words that are placed in the data port 246. This is one example of how data is loaded into the storage portion 243 during a READ transfer. This data is temporarily stored in the data storage portion 243 until the FPGA fabric 238 retrieves it. In this regard, the signal STATUS FLAG 1R from data port 246 indicates to the fabric 238 whether the concatenated data ports 244 and 246 are empty or contain data. If STATUS FLAG 1R indicates they contain data, then in due course the FPGA fabric 238 will retrieve this data from the data ports 244 and 246 in a manner that involves simultaneously transferring all 64 bits in parallel from the data ports 244 and 246 to the fabric over the two respective buses 255 and 257.

The memory controller 240 further includes a command storage portion 306 that is coupled to the FPGA fabric 238. The command storage portion 306 has six command ports 309-314, including two command ports 309 and 310 that each serve a respective one of the two bidirectional dual data ports 252 and 253, and four command ports 311-314 that each serve a respective one of the other four data ports 248-251. The command ports 309-314 are FIFOs that can each store up to 4 commands, for later processing by the memory controller 240. The command ports 309-314 each have an input that is coupled to a respective one of six command data lines CMD 0, CMD 1, CMD 2, CMD 3, CMD 4, and CMD 5, which in turn are coupled to the FPGA fabric 238. The command data lines CMD 0, CMD 1, CMD 2, CMD 3, CMD 4, and CMD 5 each include a plurality of separate lines arranged in groups that carry control, address and data signals. The command storage portion 306 receives commands from the FPGA fabric 238 through the command data lines CMD 0, CMD 1, CMD 2, CMD 3, CMD 4, and CMD 5. Each command requests a transfer of data between the FPGA fabric 238 and the DRAM 232.

The command ports 309-314 each have an input for receiving a respective one of six active-high signals CMD STATUS FLAG 0, CMD STATUS FLAG 1, CMD STATUS FLAG 2, CMD STATUS FLAG 3, CMD STATUS FLAG 4, and CMD STATUS FLAG 5. Each of these signals indicates to the associated command port that a command is being read from that command port. In addition, the command ports 309-314 each receive from the fabric 238 a respective one of six active-high port enable signals PORT ENABLE 0, PORT ENABLE 1, PORT ENABLE 3, PORT ENABLE 4, and PORT ENABLE 5. When any PORT ENABLE signal is a logic high, the associated command port is enabled, and when any PORT ENABLE signal is a logic low, the associated command port is disabled. The PORT ENABLE signals allow the fabric 238 to selectively enable and disable each of the command ports.

Each of the command ports 309-314 also has an output that carries a respective one of six active-high signals FULL FLAG 0, FULL FLAG 1, FULL FLAG 2, FULL FLAG 3, FULL FLAG 4, and FULL FLAG 5. The signals FULL FLAG 0, FULL FLAG 1, FULL FLAG 2, FULL FLAG 3, FULL FLAG 4, and FULL FLAG 5 each indicate to the FPGA fabric 238 whether the associated command port is currently full. In addition, the command ports 309-314 each have an output that carries a respective one of six active-high signals EMPTY FLAG 0, EMPTY FLAG 1, EMPTY FLAG 2, EMPTY FLAG 3, EMPTY FLAG 4, and EMPTY FLAG 5. Each of these EMPTY FLAG signals indicates when the corresponding command port is empty.

The priority information stored in the memory cells 239 informs the memory controller 240 of a user-specified order in which the command ports should be polled and read, as discussed in more detail later. During operation of the memory controller 240, the command ports are checked in an order specified by the priority information, and the first command port that is not empty and that also meets some other conditions is selected. The memory controller 240 includes a selector 318 that is a six-to-one selector capable of selecting one and only one of the six command ports 309-314. The command selector 318 has six inputs that are each coupled to a respective one of the command ports 309-314, has a select input that receives a 3-bit select signal CMD_PORT_SEL, and has an output to which it supplies a selected command CMD from one of the six command ports.

The memory controller 240 includes a controller core 319 that is coupled between the command selector 318 and the DRAM 232. The controller core 319 includes a command request output 320 at which it outputs a signal CMD REQ in order to request that a command be read from the command storage portion 306, as discussed in more detail later. The controller core 319 also has an input 321 that receives a signal CMD IN. The signal CMD IN indicates that a command from the command storage portion 306 is currently available to be read. The controller core 319 further includes a command input 324 that is coupled to the output CMD of the selector 318, and that receives selected portions of each command. In addition, the controller core 319 includes a command count input 325 that receives a signal CMD_CNT. The signal CMD_CNT is received when a command is being read from the command storage portion 306, and indicates the minimum number of memory access cycles that must be executed by the DRAM 232 in order to carry out the data transfer request in the selected command.

The controller core 319 also includes a FIFO 328 that is a storage section for temporarily storing information about each command received from the output CMD of the command selector 318. The FIFO 328 stores up to 4 words, and therefore can store information that relates to up to 4 commands received from the output CMD of the command selector 318. This information is later used by the controller core 319 to execute those commands. For example, for each command, the FIFO 328 stores a memory address from the command, and information indicating whether the command is a read or write request. Also, the FIFO 328 stores the CMD_CNT value provided for that command at the command count input 325.

The controller core 319 has outputs that supply control and addressing signals to the DRAM 232 during execution of a command. In particular, the controller core 319 includes a memory control output 329 that supplies memory control signals MEM CTRL to the memory control input 233 of the DRAM 232. Moreover, the controller core 319 includes a memory address output ADDR 330 that supplies a memory address to the memory address input ADDR 235 of the DRAM 232. In addition, the controller core 319 includes an output 331 at which it produces a memory read enable signal MEMORY READ EN that is actuated at the start of a memory READ. Also, the controller core 319 includes an output 332 at which it produces a memory write enable signal MEMORY WRITE EN that is actuated at the start of a memory WRITE.

During operation, if the FIFO 328 is not full, the controller core 319 requests a command by producing the signal CMD REQ at the output 320. In due course, the controller core 319 receives the signal CMD IN at the input 321, which indicates that a command is being read from the command storage portion 306 and is arriving at the command input 324 of the controller core 319. The controller core 319 also receives the signal CMD_CNT at its input 325. The controller core 319 stores in its FIFO 328 some of the information from the command that is being read in, along with the CMD_CNT value, as discussed above. The controller core 319 repeats this process for up to four different commands, storing information and CMD_CNT values for each such command. Meanwhile, the controller core 319 is separately and independently executing commands as they reach the end of the FIFO 328. Whenever the controller core 319 is ready to execute a command that has reached the end of the FIFO 328, the controller core 319 uses information about the command from the FIFO 328 to supply appropriate addressing and control signals to the DRAM 232.

The memory controller 240 includes an arbiter 338 that determines the order in which commands are executed, based on the priority information stored in the memory cells 239, as explained in more detail later. The arbiter 338 also controls the data ports 244-251 in a manner causing them to partially assemble or disassemble data that is being transferred between the FPGA fabric 238 and the DRAM 232.

The arbiter 338 is coupled to the command storage portion 306, the command selector 318, the memory cells 239, the controller core 319, and the data storage portion 243. The arbiter has a plurality of inputs 343-347 that are coupled to the memory cells 239, and that respectively receive the memory burst length DRAM_BL, the memory pin count DRAM PIN_COUNT, the data port configuration, the command priorities, and a signal TIME SLOTS that represents a number of time slots the arbiter is to use. The arbiter 338 also has a set of command port empty flag inputs 350-355 that each receive a respective one of the EMPTY FLAG signals from the command ports 309-314. These signals let the arbiter know whether or not each of the command ports 309-314 is empty. In addition, the arbiter 338 has a command request input 359 that receives the signal CMD REQ from the command request output 320 of the controller core 319. In response to receipt of the signal CMD REQ from the controller core 319, the arbiter 338 selects and reads a command from the command storage portion 306, in a manner explained below.

The arbiter 338 includes a command port select output 360 for supplying the 3-bit command port select signal CMD_PORT_SEL to the 3-bit control input of the six-to-one selector 318. The signal CMD_PORT_SEL selects one of the six command ports 309-314, based on factors such as the command port priorities that are stored in the memory cells 239, and the status of the EMPTY FLAG signals. The handling of priorities is discussed in more detail later.

The arbiter 338 further includes a command input 361 that is coupled to the output CMD of the selector 318, and that receives selected portions of each command. Moreover, the arbiter 338 includes some FIFOs 362 that store information about a command received at the command input 361, along with other information determined by the arbiter, as discussed in more detail later. Each of the FIFOs 362 can store up to 4 words.

In addition, the arbiter 338 has a set of command port status outputs 364-369 that each supply a respective one of the six signals CMD STATUS FLAG 0-5 to a respective one of the command ports 309-314. The arbiter 338 has an output 375 that supplies the signal CMD IN to the controller core 319, in order to indicate to the controller core that a command is being read from the command storage portion 306. Moreover, the arbiter 338 includes a command count output 376 that supplies the CMD_CNT value to the command count input 325 of the controller core 319.

The arbiter 338 includes a memory read enable input 381 that is coupled to and receives the signal MEMORY READ EN from the memory read enable output 331 of the controller core 319. In addition, the arbiter 338 includes a memory write enable input 382 that is coupled to and receives the signal MEMORY WRITE EN from the memory write enable output 332 of the controller core 319. The arbiter further includes a SUBPORT FIFO 383 that, during a data transfer, stores the addresses of selected data ports 244-251 that are currently being used for that data transfer. The SUBPORT FIFO 383 is 4 words deep, and therefore can store up to four data port addresses. For example, in a 32-bit data transfer, only one of the 32-bit data ports 244-251 is used, and the SUBPORT FIFO 383 stores only one data port address. In a 64-bit data transfer, two of the 32-bit data ports 244-251 are used, and the SUBPORT FIFO 383 stores the addresses of those two data ports. In a 128-bit data transfer, four of the 32-bit data ports are used, and the SUBPORT FIFO 383 stores the addresses of those four data ports. The arbiter 338 also includes a set of enable outputs 391-398 that are each coupled to a respective one of the data ports 244-251, and that each carry a respective one of the enable signals DF_EN 0R, DF_EN 0W, DF_EN 1R, DF_EN 1W, DF_EN 2, DF_EN 3, DF_EN4, and DF_EN 5.

During operation, the arbiter 338 receives a command request signal CMD_REQ from the controller core 319. The command request signal CMD_REQ prompts the arbiter 338 to read a command CMD from the command storage portion 306. In more detail, the arbiter 338 selects a command port from the command storage portion 306 via the selector 318. The selection is based on factors such as the command port priorities stored in the memory cells 239, and the signals EMPTY FLAG 0-5 that are received at the inputs 343-346. The arbiter 338 goes through the EMPTY FLAG signals from the command ports in a predetermined sequence that is defined by the command priorities, and selects the first command port that is not empty and that also meets other criteria (as discussed later).

When a command is read from the command storage portion 306, the command is supplied to the output CMD of the selector 318. That command CMD arrives at the command input 361 of the arbiter 338. The arbiter 338 extracts certain information from the command CMD, and stores that information in the FIFOs 362. For example, from the command CMD, the arbiter 338 extracts (1) a portion of the memory address, (2) a user burst length that is the amount of data requested to be transferred, and (3) the address of the data port through which the data is to be transferred. The arbiter 338 generates masking information that is stored in the FIFOs 362, and that indicates whether it is necessary to ignore portions of memory blocks that are accessed in the DRAM 232 while carrying out a data transfer. Also, the arbiter 338 sends the controller core 319 the signal CMD IN to indicate to the controller core 319 that a command is being read in, so that the controller core will accept selected portions of that command. Moreover, the arbiter 338 generates for that command the value CMD_CNT, and sends this value to the controller core 319. In addition, in association with a command being read in, the arbiter 338 actuates a respective one of the signals CMD STATUS FLAG 0-5 in order to advise the selected command port that a command is being read from that command port. After one or more commands have been read by the arbiter 338, the arbiter waits for one of the signals MEMORY READ EN and MEMORY WRITE EN to go high. If the signal MEMORY READ EN goes high, the arbiter 338 facilitates a read transfer to the DRAM 232. Alternatively, if the signal MEMORY WRITE EN goes high, the arbiter 338 facilitates a write transfer from the DRAM 232.

A high-level description of the operation of the entire memory controller 240 will now be provided. The memory controller 240 facilitates transfers of data between the FPGA fabric 238 and the DRAM 232. As discussed earlier, it is being assumed for the sake of this discussion that the DRAM 232 has a burst length of 8 words, and that the width of words in the DRAM has is 8 bits. In addition, for purposes of this discussion, it is being assumed that the data port configuration is such that the data ports 244 and 246 are concatenated for 64-bit read transfers, the data ports 245 and 247 are concatenated for 64-bit write transfers, the data ports 248 and 250 are each separately configured for 32-bit read transfers, and the data ports 249 and 251 are each configured for 32-bit write transfers. Before providing a write command to the command storage portion 306, the FPGA fabric 238 loads the data to be transferred into the appropriate data port(s). For example, the FPGA fabric looks at the STATUS FLAG signal from the particular data port that is to be used to temporarily store data for the transfer. When the STATUS FLAG is asserted, the corresponding data port is full, and so the fabric 238 has to wait before providing data to the data port. When that STATUS FLAG is deasserted, the corresponding data port is available to accept the data that is to be transferred, and the FPGA fabric 238 can then supply to the appropriate data port all of the data that is to be transferred, before providing the associated write command to the command storage portion 238.

The FPGA 238 supplies the command storage portion 306 with a command in the following manner (after supplying data to the associated data port if the command is a write command). The FPGA fabric 238 checks to see if the FIFO in the command port of interest is full before loading a command into that command port. When one of the command ports 309-314 is full, its FULL FLAG is asserted so the FPGA fabric 238 knows that particular command port is full. The FPGA fabric 238 selectively loads commands into the command ports 309-314 when the command ports are not full, as necessary for desired memory reads or writes. In due course, the controller core 319 requests that a command be read in from the command storage portion 306, by supplying the signal CMD REQ to the arbiter 338. The arbiter 338 then selects a command port based on factors that include the EMPTY FLAG signals 350-353 and the command priorities in the memory cells 239, as discussed in more detail later. The arbiter 338 accesses the selected command port by sending the 3-bit select signal CMD_PORT_SEL to the select input of the command selector 318. The selected command is then routed through the command selector 318 to its output. The command that is supplied to the output of the command selector 318 makes its way to the command inputs 324 and 361 of the controller core 319 and arbiter 338, respectively.

For each command, the arbiter 338 uses the DRAM_BL, the DRAM_PIN_COUNT, and the DATA PORT CONFIGURATION from the memory cells 239, along with some information extracted from the command, to determine masking information and a value CMD_CNT for that command. After determining the command count CMD_CNT, the arbiter 338 supplies CMD_CNT to the input 325 of the controller core 319. The arbiter 338 then supplies the signal CMD IN to the controller core 319 to indicate that a command is currently being read from the command storage portion 306 and is arriving at the input 324 of the controller core. The controller core 319 stores the CMD_CNT value in the FIFO 328, along with information extracted from the command, such as a starting memory address, and whether the memory access will be a READ or WRITE. Meanwhile, the arbiter 338 stores in the FIFOs 326 the mask information that it has generated, along with information extracted from the command, such as the user burst length, and the address of the data port that will be used for the transfer. The arbiter 338 uses one of the signals CMD STATUS FLAG 0-5 that is associated with the selected command port to notify that command port that a command is being read from it. This process of filling up the FIFOs 328 and 362 in the controller core 319 and arbiter 338, respectively, can continue for up to four commands.

Meanwhile, in parallel with this process of loading commands into the FIFOs 328 and 362, the controller core 319 and the arbiter 338 are executing commands as they reach the end of the FIFOs 328 and 362. When a command is executed by the controller core 319 and the arbiter 338, the information previously stored for that command in the FIFOs 328 and 362 is extracted from the FIFOs, and is used to execute the command.

The controller core 319 initiates execution of a command by sending the starting memory address to the ADDR input 235 of the DRAM 232, and by sending control signals to the MEM CTRL inputs 233 of the DRAM 232. Moreover, the controller core 319 supplies a read or write enable signal MEMORY READ EN or MEMORY WRITE EN to the arbiter 338 at one of its respective inputs 381 and 382. In response to receipt of one of these signals, the arbiter 338 reads from its FIFOs 362 the information for that command, and then loads the SUBPORT FIFO 383 with the addresses of one or more data ports that are to be used for the data transfer. Based on the command and mask information stored in the FIFOs 362, the arbiter 338 selectively asserts the DF_EN signals in a manner so that the data ports being used for that data transfer are enabled at appropriate times.

For a READ data transfer, the DRAM 232 transfers data in successive words of 8 bits each over the data bus 236 and into the data converter 241. Each pair of successive 8-bit words that are supplied to the data converter 241 are combined into a single 16-bit word that is then transferred over the data bus 242 to the data storage portion 243. As the enable signals DF_EN enable the appropriate data port or ports, the data is stored in the data storage portion 243. Eventually, 32 bits of data are stored in each data port being used for the READ transfer. In due course, the FPGA fabric 238 reads the 32 bits of data that are stored in each data port being used for the READ transfer.

For a WRITE data transfer, the arbiter 338 asserts one or more of the enable signals DF_EN so that the 32 bits of data in each data port being used for the WRITE transfer are transferred in successive groups of 16 bits over the data bus 242 and into the data converter 241. Each 16-bit word that is supplied to the data converter 241 is divided into a pair of 8-bit data memory words that are successively transferred over the data bus 236 to the DRAM 232. In some situations, the start memory address and/or the end memory address of the data being transferred falls on an address that is not on a memory address boundary. In that situation, as to memory locations in the memory access that are before and/or after the locations actually being written, no data port is enabled, which in turn causes the signal MASK to go high while those locations are accessed, in order to notify the DRAM 232 that it should not change the data already stored in those memory locations.

A discussion will now be provided of how the arbiter 338 selects one of the six command ports 309-314 as the port from which a command will be read. First, although there are six command ports 309-314, some of these command ports may not be utilized, or in other words may be not active. More specifically, as discussed earlier, each of the command ports 309-314 corresponds to a respective one of the six data ports DATA PORT 0 (252), DATA PORT 1 (253), DATA PORT 2 (248), DATA PORT 3 (249), DATA PORT 4 (250), and DATA PORT 5 (251). As also discussed earlier, during field configuration, it is possible for a user to elect to concatenate two or four of the 32-bit data ports, in order to define a 64-bit data port or a 128-bit data port. If two data ports are concatenated, then only one of the two corresponding command ports is needed to operate the concatenated data port. Similarly, if four data ports are concatenated, then only one of the four corresponding command ports is needed to operate the concatenated data port. Consequently, whenever data ports are concatenated at the time of field configuration, then any of the command ports 309-314 that is not needed is designated as inactive, rendering it unavailable for use at any time during operation of the device.

It should be noted that the status of a given command port as active or inactive is different from its status as enabled or disabled under control of one of the signals PORT ENABLE 0 to PORT ENABLE 5 from the fabric 238. The active or inactive status of a command port is set at the time of field configuration, and does not subsequently change. Command ports that are designated as inactive cannot be used during operation of the device, whereas command ports that are designated as active can be used. If any given command port is designated as active, then during operation of the device the fabric 238 can dynamically enable and disable that command port using the corresponding one of the signals PORT ENABLE 0 to PORT ENABLE 5.

FIG. 4 is a diagram showing twelve time slots that are used by the arbiter 338 as it selects command ports from which it will read commands. There are twelve successive time slots 1 through 12. As discussed in more detail later, there are circumstances in which the arbiter uses all twelve time slots, and other circumstances in which the arbiter uses only ten of the twelve time slots. The arbiter begins with time slot 1, and proceeds successively through the time slots until it reaches time slot 10. If only ten time slots are being used, then the arbiter returns from time slot 10 directly back to time slot 1. On the other hand, if all twelve time slots are being used, then the arbiter proceeds from time slot 10 on to time slot 11 and then time slot 12, and then returns to time slot 1. Time slots 11 and 12 are depicted with broken lines in FIG. 4, to reflect that fact that they may or may not be used.

The determination of whether to use ten or twelve time slots occurs at the time of field configuration, and depends on how many of the command ports 309-314 are designated as active. In the disclosed embodiment, the number of time slots is intentionally selected to be an integer multiple of the number of command ports that are designated as active. Stated differently, the number of time slots is selected to be a number that is evenly divisible by the number of active command ports. This is depicted in Table 1 below. The left column of Table 1 shows the number of command ports that are designated to be active at the time of field configuration. Each number in the left column is evenly divisible into twelve time slots, with the exception of a situation where there are five active command ports. Consequently, in the disclosed embodiment, and as shown in the center column of Table 1, if there are five active command ports, then ten time slots are used. Otherwise, twelve time slots are used. (Alternatively, if the number of active command ports is one or two, ten time slots could be used). The right column of Table 1 shows that if twelve time slots are used, then one of the memory cells 239 (FIG. 3) is set at the time of field configuration to be a binary "1". On the other hand, if ten time slots are used, then that memory cell is set at the time of field configuration to be a binary "0". The output of this memory cell is the signal TIME SLOTS (FIG. 3) that is supplied from the memory cells 239 to the arbiter 338.

TABLE 1

| NUMBER OF ACTIVE COMMAND PORTS | NUMBER OF TIMESLOTS | MEMORY CELL |
|---|---|---|
| 1 | 12 (or 10) | 1 (or 0) |
| 2 | 12 (or 10) | 1 (or 0) |
| 3 | 12 | 1 |
| 4 | 12 | 1 |
| 5 | 10 | 0 |
| 6 | 12 | 1 |

A respective different priority definition or priority list is associated with each of the time slots shown in FIG. 4. Each of the priority definitions is a list of all the active command ports, from highest priority to lowest priority. During each time slot, the arbiter identifies the command ports that are active, currently enabled, and contain a command awaiting execution. Then, from this subset of the command ports, the arbiter selects the command port that has the highest priority according to the priority definition associated with that particular time slot. A command is then read from that selected command port. If none of the command ports can be selected during a given time slot (for example because none of the command ports currently happen to contain a command awaiting execution), then the arbiter does not read in any command during the current time slot, but instead moves ahead to the next time slot.

FIG. 5 is a diagram showing the twelve time slots of FIG. 4, and also showing examples of priority definitions for each of the time slots. Each row in FIG. 5 represents a respective time slot. The left column contains the numbers of the time slots. The remaining six columns of each row set forth a priority definition for that time slot, in the form of a list of the six command ports (0 to 5) where the order from left to right is the order of priority for that time slot, from highest priority to lowest priority. Thus, for example, as to time slot 1, the command port priority from highest to lowest is 0, 1, 2, 3, 4, 5. For time slot 10, the command port priority, from highest to lowest, is 5, 2, 1, 0, 4, 3. The priority definitions for all time slots are specified by a user at the time of field configuration of the FPGA 100.

Each priority definition includes only command ports that are designated as active. Thus, FIG. 5 represents a hypothetical situation where all six command ports happen to be designated as active. If one of the six command ports had been designated as inactive, then it would not appear in any priority definition, and the right column in FIG. 5 would be empty. If two command ports had been designated as inactive, neither would appear in any priority definition, and the two right columns in FIG. 5 would be empty.

In the disclosed embodiment, it is a requirement that, at the time of field configuration, each active command port be given the highest level of priority in at least one of the priority definitions, or in other words in at least one time slot. In addition, it is a requirement that each priority definition include all of the active command ports. Alternatively, however, it would be possible to permit a user to specify priority definitions in which one or more of the command ports are never given the highest priority in any of the priority definitions, and/or in which fewer than all active command ports are listed.

The arrows in FIG. 5 represent a hypothetical sequence that might be followed by the arbiter 338 in selecting command ports, where the rectangles with stippling designate command ports from which the arbiter reads a command. Beginning with time slot 1, the priority definition specifies that command port 0 has the highest priority, and the arbiter 338 finds that command port 0 is active, currently enabled, and contains a command. Therefore, since command port 0 has the highest priority in time slot 1, the arbiter reads the command from command port 0. During each time slot, the arbiter reads no more than one command, even if two or more ports are active and enabled, and contain commands. Therefore, in FIG. 5, after reading the command from command port 0 in time slot 1, the arbiter moves on to time slot 2.

In time slot 2, the associated priority definition specifies that command port 0 still has the highest priority, but the arbiter finds that this command port is either not enabled, or does not contain a command. Therefore, the arbiter checks the command port specified to have the next highest priority in time slot 2, which is command port 1. The arbiter finds that command port 1 is active, currently enabled, and contains a command. The arbiter therefore reads that command, and then proceeds to time slot 3.

In time slot 3, the priority definition indicates that command port 1 has the highest priority, but the arbiter finds that command port 1 is either disabled or does not contain a command. The arbiter therefore checks command port 0 because it has the next highest priority in that time slot, and finds that command port 0 is active, currently enabled, and contains a command. The arbiter therefore reads a command from command port 0, and then proceeds to time slot 4.

In time slot 4, the arbiter uses the priority definition for time slot 4 to successively check all six of the time slots in the order specified by that priority definition, which is 1, 2, 0, 3, 5, 4. For the sake of this discussion, assume that none of these command ports happens to contain a command during time slot 4. As a result, the arbiter does not read any command in time slot 4, but instead proceeds to time slot 5. The remaining arrows in FIG. 5 should be generally self-explanatory, and are not described in detail here.

Figure 6A:
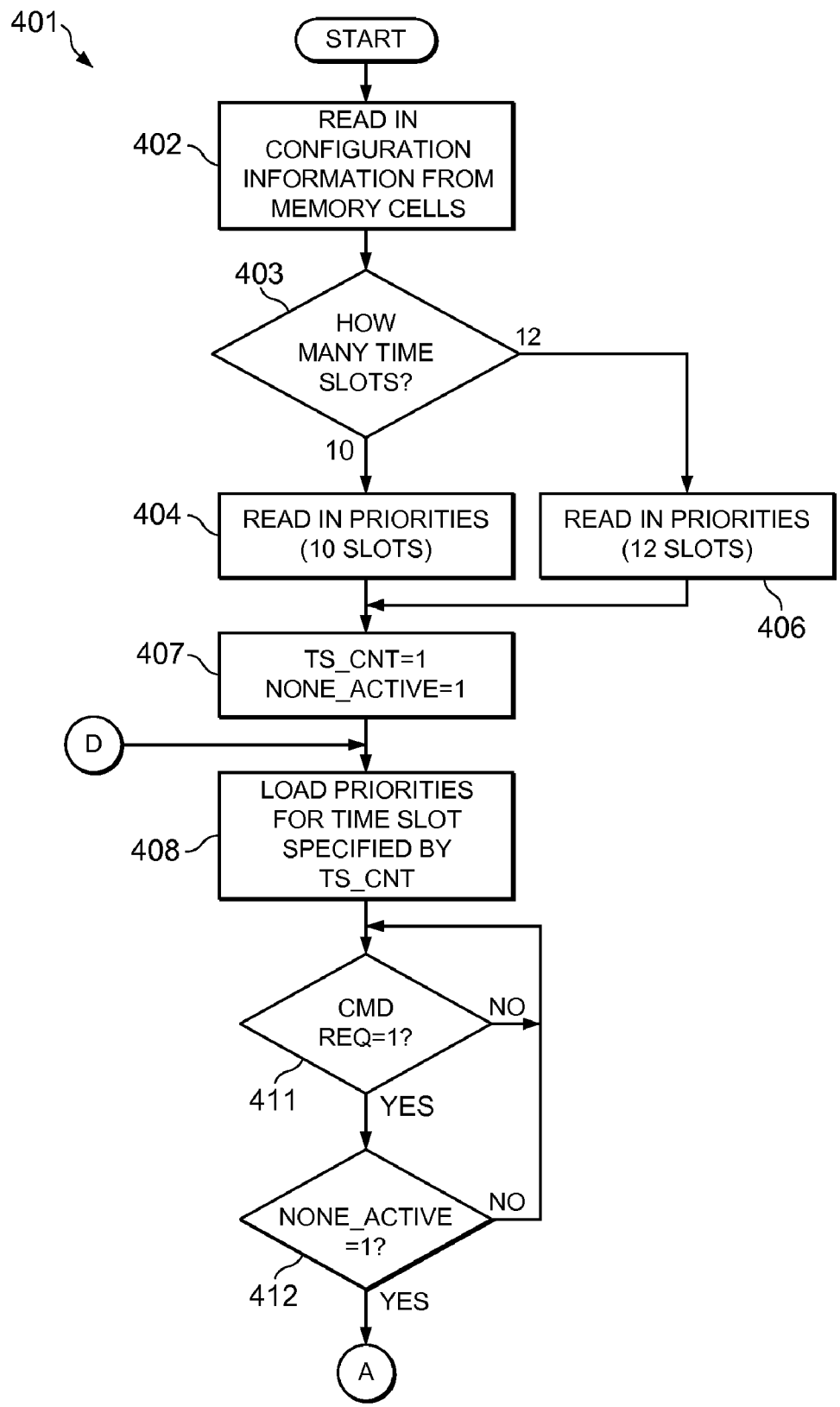
FIG. 6 (which includes FIGS. 6A-6C) is a flowchart showing a method implemented by hard-wired circuitry within the arbiter of FIG. 3.
Figure 6B:
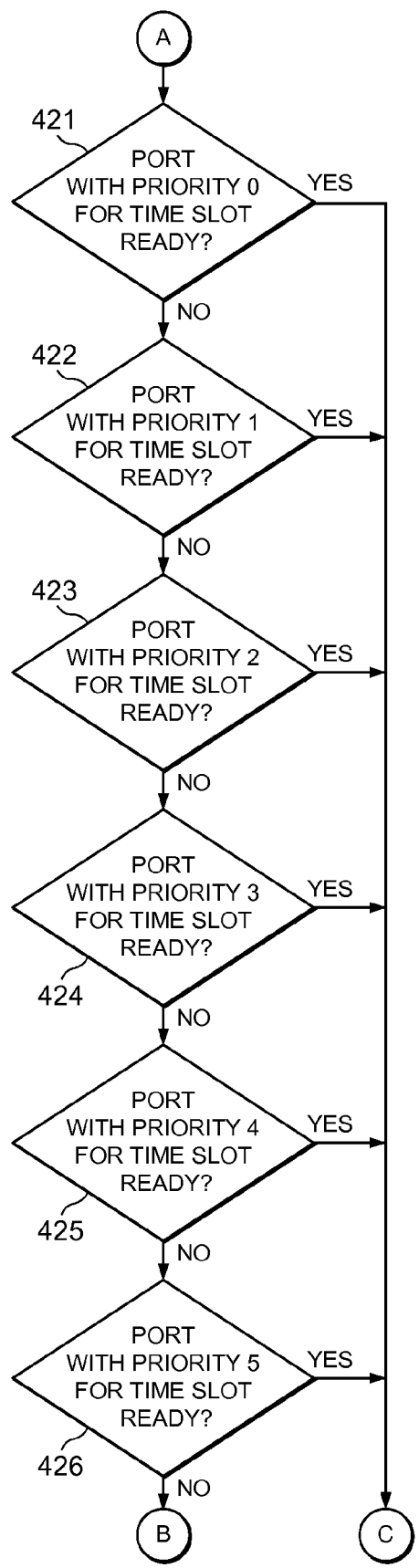
Figure 6C:
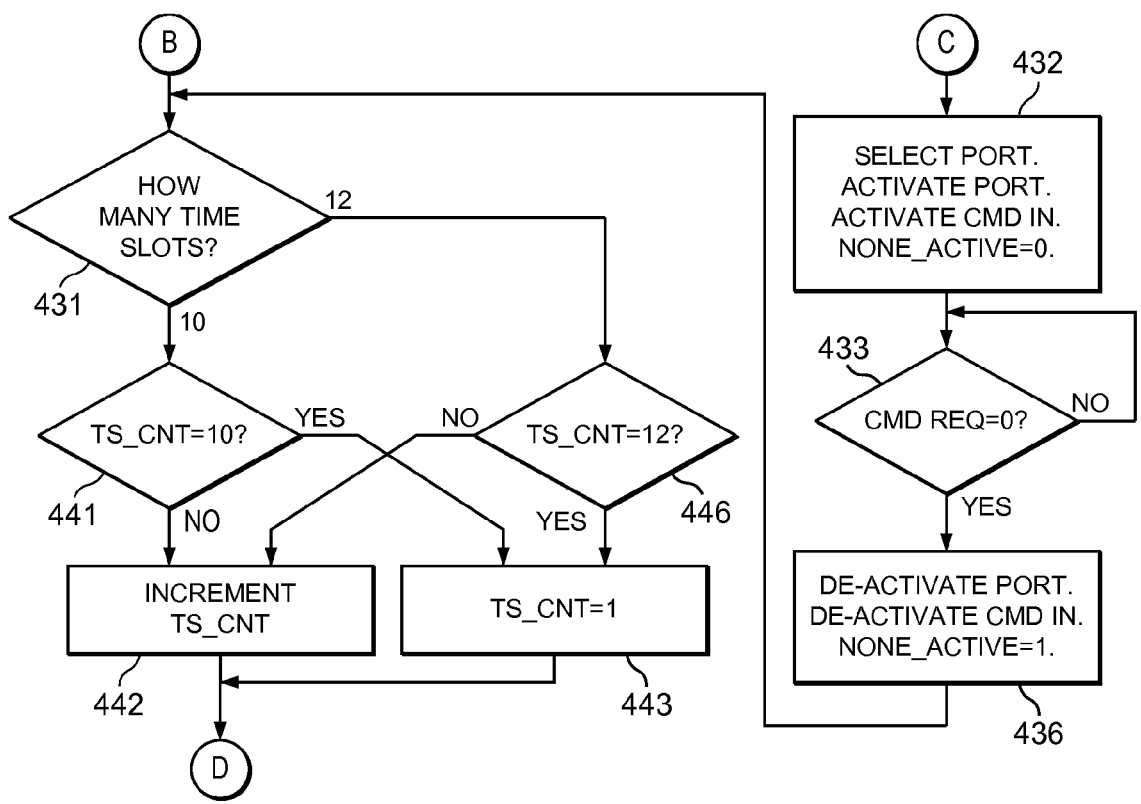

The arbiter 338 of FIG. 3 includes hard-wired circuitry that is created by first defining the circuitry in the VERILOG® hardware design language (HDL) available commercially from Cadence Design Systems Inc. of San Jose, Calif., and by then compiling the VERILOG® code in order to obtain the actual hard-wired circuitry of the arbiter. FIG. 6 (which includes FIGS. 6A-6C) is a flowchart showing a method 401 implemented by the hard-wired circuitry in the arbiter 338. The method 401 depicted in FIG. 6 represents only a portion of the overall operation of the arbiter 338, and in particular a portion that is relevant to an understanding of the disclosed embodiment of the invention. The arbiter 338 performs a number of other functions that are not necessary to an understanding of the disclosed embodiment of the invention, and that are therefore not depicted in FIG. 6. The flowchart of FIG. 6 is a convenient way of showing how the hard-wired circuitry in the arbiter 338 carries out selection of one of the command ports 309-314 from which a command will be read. Alternatively, however, instead of having hard-wired circuitry that implements the functionality shown in FIG. 6, the arbiter could have a high-speed processor that carries out the method 401 by executing software or firmware code.

The method 401 of FIG. 6 begins at block 402. Following a system power-up or a system reset, the arbiter 338 performs some initialization, including reading in configuration information from the memory cells 239 (FIG. 3). In particular, the arbiter reads in the data port configuration information, from which the arbiter can indirectly identify which command ports have been configured to be active, and which have been configured to be inactive. The arbiter also reads in the 1-bit TIME SLOTS signal, which indicates whether the arbiter should use ten or twelve time slots. Control then proceeds to block 403.

In block 403, the arbiter checks the 1-bit TIME SLOTS signal obtained from the memory cells 239, in order to see how many time slots it is to use. If the TIME SLOTS signal is a binary "1", then the arbiter is to use twelve time slots, whereas if the signal is a binary "0", then the arbiter is to use ten time slots. If the arbiter is to use ten time slots, then control proceeds to block 404, where the arbiter reads in the command port priorities for ten time slots, or in other words ten priority definitions. Alternatively, if it is determined in block 403 that the arbiter is to use twelve time slots, then control proceeds from block 403 to block 406, where the arbiter reads in command port priorities for twelve slots, or in other words twelve priority definitions. From either of blocks 404 and 406, control proceeds to block 407.

In block 407, the arbiter 338 initializes a time slot count variable TS_CNT to a value of 1. This variable always contains the number of the current time slot. The arbiter also initializes another variable NONE_ACTIVE to a binary "1", in order to indicate that none of the six command ports 309-314 are currently being accessed. Control then proceeds to block 408.

As discussed above in association with blocks 404 and 406, the arbiter has already read in from the memory cells 239 all of the ten or twelve priority definitions that it will need to use. In block 408, the arbiter selects and loads one of these priority definitions that corresponds to the current time slot, as identified by the time slot count variable TS_CNT. Control then proceeds to block 411, where the arbiter checks the command request signal CMD REQ from the controller core 319, in order to determine whether the controller core is currently ready for a command, and therefore asking the arbiter to read in a command. If the controller core is not requesting a command, then the arbiter remains in block 411 until the controller core does request a command. When the arbiter determines in block 411 that the controller core is requesting a command, the arbiter proceeds from block 411 to block 412. In block 412, the arbiter checks the variable NONE_ACTIVE, in order to determine whether a command already is currently being read in from any of the six command ports 309-314. If a command is already being read from any of the command ports, then control returns to block 411. Otherwise, control proceeds from block 412 to block 421.

In block 421, the arbiter 338 identifies the command port that, in the priority definition for the current time slot, has been assigned the highest priority level (which is level 0). The arbiter checks to see whether that command port is "ready", or in other words currently meets certain criteria. First, the command port must be designated as active, but the arbiter already knows that the command port is necessarily designated as active, because only active command ports are listed in priority definitions. In addition, in order to be considered "ready", the command port must be currently enabled by the fabric 238, and must contain at least one command, as indicated by the corresponding one of the EMPTY FLAG signals 350-355.

If that command port is not ready to deliver a command, then the arbiter 338 moves from block 421 to block 422, where it identifies the command port that, in the priority definition for the current time slot, has been assigned the second highest priority level (which is level 1). The arbiter checks to see whether that command port is "ready", in the manner discussed above. If none of the active command ports currently meets all the criteria needed to be "ready" to deliver a command, then the arbiter will end up successively working its way through each of blocks 421 to 426, checking each of the active command ports in the order of priority (highest to lowest) that is specified by the priority definition for the current time slot. Then, because none of the command ports are ready to deliver a command, the arbiter will proceed from block 426 to block 431, which will be discussed later. On the other hand, as the arbiter proceeds through the blocks 421 to 426 and successively checks command ports in the order of progressively decreasing priority, if the arbiter finds in any of blocks 421 to 426 that a command port meets all of the criteria needed to be considered "ready" to deliver a command, then the arbiter proceeds directly from that block to block 432, which is discussed below.

In FIG. 6, the sequential arrangement of blocks 421 to 426 suggests that the decisions made in these blocks are carried out in succession, but this sequential arrangement is used solely for the purpose of clarity in conveying a clear understanding of what the arbiter does. In the disclosed embodiment of the arbiter 338, the hard-wired circuitry that implements blocks 421 to 426 actually carries out all of the decisions in these blocks substantially simultaneously, thereby facilitating high speed operation of the arbiter 338.

Focusing now on block 432, the arbiter controls the 3-bit command port select signal CMD_PORT_SEL (FIG. 3) in a manner causing the multiplexer 318 to select the particular command port that was determined to be "ready" to deliver a command. Then, the arbiter uses the corresponding command status flag CMD STATUS FLAG signal to activate that particular command port. The oldest command in that command port will then pass through the multiplexer 318 and be present at the input 324 of the controller core 319 and at the input 361 of the arbiter 338.

The arbiter will activate the CMD IN signal to the controller core 319 to instruct the controller core to read in relevant portions of the command. The arbiter itself will also read in relevant portions of the command. The arbiter will internally set its variable NONE_ACTIVE to a binary "0", in order to indicate to itself that one of the command ports is currently being accessed. The arbiter will then proceed to block 433, where it waits for the controller core 319 to deactivate the CMD REQ signal, as an indication that the controller core has completed reading in the command. The arbiter then proceeds from block 433 to block 436, where it deactivates the appropriate CMD STATUS FLAG signal in order to deactivate the selected command port, and also deactivates the CMD IN signal to the controller core 319. The arbiter also changes its internal variable NONE_ACTIVE to a binary "1", in order to indicate to itself that no command port is currently being accessed. From block 436, the arbiter proceeds to block 431.

In block 431, the arbiter again checks the TIME SLOTS signal received from the memory cells 239, in order to determine whether it is using ten time slots or twelve time slots. If it is using ten time slots, then control proceeds to block 441, where the arbiter checks to see if the time slot count variable TS_CNT has reached its maximum value of 10. If not, then control proceeds to block 442, where the arbiter increments the variable TS_CNT. Otherwise, control proceeds from block 441 to block 443, where the arbiter resets the time slot count variable TS_CNT to a value of 1. Alternatively, if the arbiter determines in block 431 that it is using twelve time slots, then control proceeds to block 446, where the arbiter checks to see if the time slot count variable TS_CNT has reached its maximum value of 12. If not, then control proceeds to block 442, where the variable TS_CNT is incremented. Otherwise, control proceeds from block 446 to block 443, where the time slot count variable TS_CNT is reset to a value of 1. From either of blocks 442 and 443, control returns to block 408.

Although a selected embodiment has been illustrated and described in detail, it should be understood that substitutions and alterations are possible without departing from the spirit and scope of the present invention, as defined by the claims that follow.

What is claimed is:

1. An apparatus comprising a programmable device that includes:
    an interface;
    a plurality of command ports that can each receive commands, each command requesting an information transfer through the interface; and
    arbitration circuitry configurable during field programming to include a selected number of priority definitions, the selected number being determined during field programming, and each priority definition being configurable during field programming to specify an order of priority for a group of the command ports, wherein in operation, the arbitration circuitry uses the priority definitions in succession and, for each of the priority definitions, causes a command to be accepted from the command port of highest priority that contains a command.

2. An apparatus according to claim 1,
    wherein the command ports are each configurable during field programming to be designated as one of active and inactive;
    wherein the selected number is determined during field programming as a function of the number of the command ports that are specified to be active;
    wherein the configuration of each priority definition during field programming is carried out so that the associated group of the command ports includes only command ports that are active; and
    wherein, for each of the priority definitions, the arbitration circuitry causes a command to be accepted from the command port of highest priority that contains a command and is active.

3. An apparatus according to claim 2, wherein the selected number of the priority definitions is greater than or equal to the number of the command ports that are active.

4. An apparatus according to claim 3, wherein each of the command ports that is active is assigned the highest priority in at least one of the priority definitions.

5. An apparatus according to claim 3, wherein the selected number of priority definitions is an integer multiple of the number of the command ports that are active.

6. An apparatus according to claim 5, wherein the selected number of the priority definitions is selected during field programming from a plurality of different predetermined numbers.

7. An apparatus according to claim 6,
    wherein there are six of the command ports, and the plurality of predetermined numbers includes the number ten and the number twelve;
    wherein if the number of the command ports that are active is one of one and two, then the selected number is one of ten and twelve;
    wherein if the number of the command ports that are active is one of three, four and six, then the selected number is twelve; and
    wherein if the number of the command ports that are active is five, then the selected number is ten.

8. An apparatus according to claim 7, wherein if the number of the command ports that are active is one of one and two, then the selected number is twelve.

9. An apparatus according to claim 2,
    wherein each of the command ports that is active can be selectively enabled and disabled in a dynamic manner during operation of the device after field programming thereof; and
    wherein the arbitration circuitry, for each of the priority definitions, causes a command to be accepted from the command port of highest priority that contains a command, is active, and is currently enabled.

10. An apparatus according to claim 1, wherein the arbitration circuitry exists within the device before field programming thereof.

11. An apparatus according to claim 1,
    wherein the interface is a memory interface;
    wherein the device includes a memory controller circuit that controls the memory interface, the memory controller circuit including the command ports and arbitration circuitry; and
    wherein the device includes a further circuit that is operatively coupled to the memory controller circuit and that provides commands to the command ports.

12. A method involving an apparatus having a programmable device that includes an interface and a plurality of command ports that can each receive commands, each command requesting an information transfer through the interface, the method comprising:
    selecting during field programming a number of priority definitions;
    configuring each of the priority definitions during field programming to specify an order of priority for a group of the command ports; and
    using the priority definitions in succession and, for each of the priority definitions, causing a command to be accepted from the command port of highest priority that contains a command.

13. A method according to claim 12,
    including configuring each of the command ports during field programming to be designated as one of active and inactive;
    wherein the selecting of the selected number during field programming is carried out as a function of the number of the command ports that are specified to be active;
    wherein the configuring of the priority definitions is carried out so that, for each of the priority definitions, the associated group of the command ports includes only command ports that are active; and
    wherein the using includes, for each of the priority definitions, causing a command to be accepted from the command port of highest priority that contains a command and is active.

14. A method according to claim 13, wherein the selecting is carried out so that the selected number is greater than or equal to the number of the command ports that are active.

15. A method according to claim 14, wherein the configuring of the priority definitions is carried out so that each of the command ports that is active is assigned the highest priority in at least one of the priority definitions.

16. A method according to claim 14, wherein the selecting is carried out so that the selected number is an integer multiple of the number of the command ports that are active.

17. A method according to claim 16, wherein the selecting includes selecting the selected number from a plurality of different predetermined numbers.

18. A method according to claim 17,
wherein there are six of the command ports, and the plurality of predetermined numbers includes the number ten and the number twelve;
wherein if the number of the command ports that are active is one of one and two, then the selected number is one of ten and twelve;
wherein if the number of the command ports that are active is one of three, four and six, then the selected number is twelve; and
wherein if the number of the command ports that are active is five, then the selected number is ten.

19. A method according to claim 18, wherein if the number of the command ports that are active is one of one and two, then the selected number is twelve.

20. A method according to claim 13,
including selectively enabling and disabling each of the command ports that is active in a dynamic manner during operation of the device after field programming thereof; and
wherein the using includes, for each of the priority definitions, causing a command to be accepted from the command port of highest priority that contains a command, is active, and is currently enabled.

* * * * *